United States Patent
Mansuri et al.

(10) Patent No.: US 7,697,601 B2
(45) Date of Patent: Apr. 13, 2010

(54) EQUALIZERS AND OFFSET CONTROL

(75) Inventors: Mozhgan Mansuri, Hillsboro, OR (US);
Frank O'Mahony, Portland, OR (US);
Bryan K. Casper, Hillsboro, OR (US);
James E. Jaussi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1164 days.

(21) Appl. No.: 11/268,911

(22) Filed: Nov. 7, 2005

(65) Prior Publication Data
US 2007/0115048 A1 May 24, 2007

(51) Int. Cl.
*H03H 7/30* (2006.01)
(52) U.S. Cl. ..................... 375/229
(58) Field of Classification Search ......... 375/229–236; 333/18
See application file for complete search history.

(56) References Cited

U.S. PATENT DOCUMENTS

| | | | |
|---|---|---|---|
| 4,565,974 A * | 1/1986 | Smoot | 330/304 |
| 6,420,932 B1 | 7/2002 | Casper | |
| 6,614,301 B2 | 9/2003 | Casper et al. | |
| 6,621,330 B1 | 9/2003 | Jaussi et al. | |
| 6,624,688 B2 | 9/2003 | Jaussi et al. | |
| 6,701,466 B1 * | 3/2004 | Fiedler | 714/699 |
| 6,756,841 B2 | 6/2004 | Jaussi et al. | |
| 6,791,399 B2 | 9/2004 | Jaussi et al. | |
| 6,798,293 B2 | 9/2004 | Casper et al. | |
| 6,946,902 B2 | 9/2005 | Jaussi et al. | |
| 7,003,043 B2 | 2/2006 | Casper et al. | |
| 7,180,354 B2 * | 2/2007 | Gabillard et al. | 327/307 |
| 2003/0141929 A1 | 7/2003 | Casper et al. | |

* cited by examiner

*Primary Examiner*—Kevin Y Kim
(74) *Attorney, Agent, or Firm*—Erik R. Nordstrom

(57) ABSTRACT

In some embodiments, equalizer circuits with controllably variable offsets at their outputs are provided.

16 Claims, 3 Drawing Sheets

EQUALIZERS AND OFFSET CONTROL

BACKGROUND

With point to point links (e.g., in chip to chip communications), as data rates increase, inter symbol interference (ISI) can become more problematic due, for example, to channel bandwidth limitations. With ISI, timing uncertainties can increase resulting in higher bit error rates for recovered data. To reduce ISI, a high-pass filter (either in the transmitter or receiver) may be used to equalize the low-pass behavior of a channel for a given data rate. In some applications, high-pass filters may be used to insert a zero, for example, in a receiver side amplifier.

With active equalizers, the zero frequency can be adjusted in order, e.g., to adjust for different data rates. However, it may be desirable to be able to have more adjustment capability, e.g., to equalize for channel variations. Other issues with receiver side equalizers may also be considered. For example, with a differential equalizer, it may be desirable to be able to adjust the offset between the differential signals.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
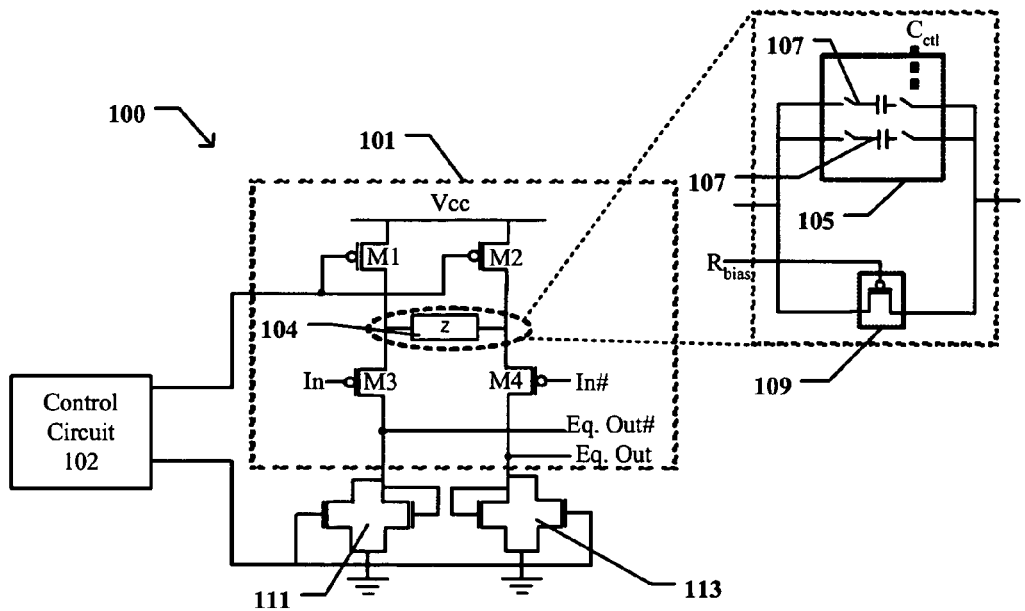
FIG. 1 is a schematic diagram of an equalizer circuit according to some embodiments.

FIG. 1 shows a tunable, continuous-time equalizer circuit 100 in accordance with some embodiments. Equalizer circuit 100 generally comprises a tuneable differential amplifier 101, a control circuit 102, and tuneable symmetric loads 111, 113. The differential amplifier 101 is coupled to the symmetric loads 111, 113 to provide an amplified differential output signal (Eq. Out/Eq. Out#) based on a differential input signal (In/In#). The control circuit 102 is coupled to both the amplifier 101 and symmetric loads 111, 113 to control the gain and frequency response of the amplifier 101, as well as the load characteristics of the symmetric loads 111, 113. In some embodiments, control circuit 102 may comprise a self-biasing circuit, for example, comprising a replica bias circuit, although any suitable circuit for controlling amplifier 101 and/or symmetric loads 111, 113 may be implemented.

Differential amplifier 101 comprises current source transistors M1, M2, differential signal input transistors M3, M4 and a tuneable complex impedance 104. In the depicted embodiment, tuneable complex impedance 104 comprises a variable capacitive load 105 coupled in parallel to a variable resistive load 109. In general, a tuneable complex impedance refers to any complex impedance (having both real and imaginary components) that is tuneable (controllably variable, for example, by a control circuit such as control circuit 102). In the depicted embodiment, both the resistive and imaginary (capacitive in this case) components are variable. (This may be desired but is not necessary.) The variable capacitance 105 is implemented with a combination of selectably engageable capacitors 107, e.g., via a digital signal from control circuit 102, while the variable resistance 109 is implemented with a transistor whose resistance is controlled via a bias signal, $R_{bias}$, from control circuit 102.

A current source is formed from matched transistor pair M1, M2 coupled together through the tuneable complex impedance 104. In this case, the complex impedance acts as a high pass filter between the split current source transistors M1, M2. At relatively low input signal frequencies, the capacitive component has a high impedance resulting in the complex impedance 104 being relatively high. However, as the frequency of the input signal increases, the impedance of capacitive component 105 goes down thereby lowering the overall impedance of tuneable impedance 104. As this occurs, the strength of the current source increases, which results in an amplification of the differential output signal (Eq. Out/Eq. Out#) at the symmetric loads 111, 113.

The term "symmetric load" is used in its normal sense and generally refers to a load comprising active components configured to provide a suitably linear load impedance over a selectably controllable (tuneable) operating range. In the depicted embodiment, symmetric loads 111 and 113 are each implemented with a diode-connected NMOS transistor coupled across a controllably biased NMOS transistor, whose gate is coupled to the control circuit 102 for controlling the load characteristics of the symmetric loads 111, 113.

Note that in the depicted embodiment, transistors M1 to M4 are implemented with PMOS transistors, while the symmetric loads are implemented with NMOS transistors. The term "PMOS transistor" refers to a P-type metal oxide semiconductor field effect transistor. Likewise, "NMOS transistor" refers to N-type metal oxide semiconductor field effect transistors. It should be appreciated that whenever the terms: "transistor", "MOS transistor", "NMOS transistor", or "PMOS transistor" are used, unless otherwise expressly indicated or dictated by the nature of their use, they are being used in an exemplary manner. They can encompass the different varieties of MOS devices including devices with different $V_{TS}$ and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

In operation, a differential input signal (In/In#), e.g., from receiver side termination resistors coupled to a transmitter on a separate chip) is received at the gates of differential input transistors M3, M4. The signal is amplified and provided as a differential output signal (Eq. Out/Eq. Out#) at symmetric loads 111, 113. Depending upon particular channel characteristics, the operating frequency of the received input signal, and/or desired operating parameters, the frequency response and gain of the differential amplifier 101 may be suitably controlled by the control circuit 102. In addition, for better equalization and control, the load characteristics (e.g., resistive slope, frequency response) of the symmetric loads 111, 113 may also be controlled by control circuit 102. This can allow for improved equalization and other benefits such as power supply noise rejection. For example, in some embodiments, due to the I-V characteristics of a symmetric load, the output swing may be controlled to vary over a smaller voltage range thereby allowing a wider range of adaptation before the differential pairs (M1/M2 and/or M3/M4) enter a triode region.

In some applications, it may be desirable to control the offset voltage of the differential output signal (Out/Out#). For example, in some on-die waveform capture applications, an aggregate systematic offset adjustment capability (e.g., up to +/−400 mV) may be desired. Accordingly, in the following sections, embodiments including offset control features are presented.

Figure 2:
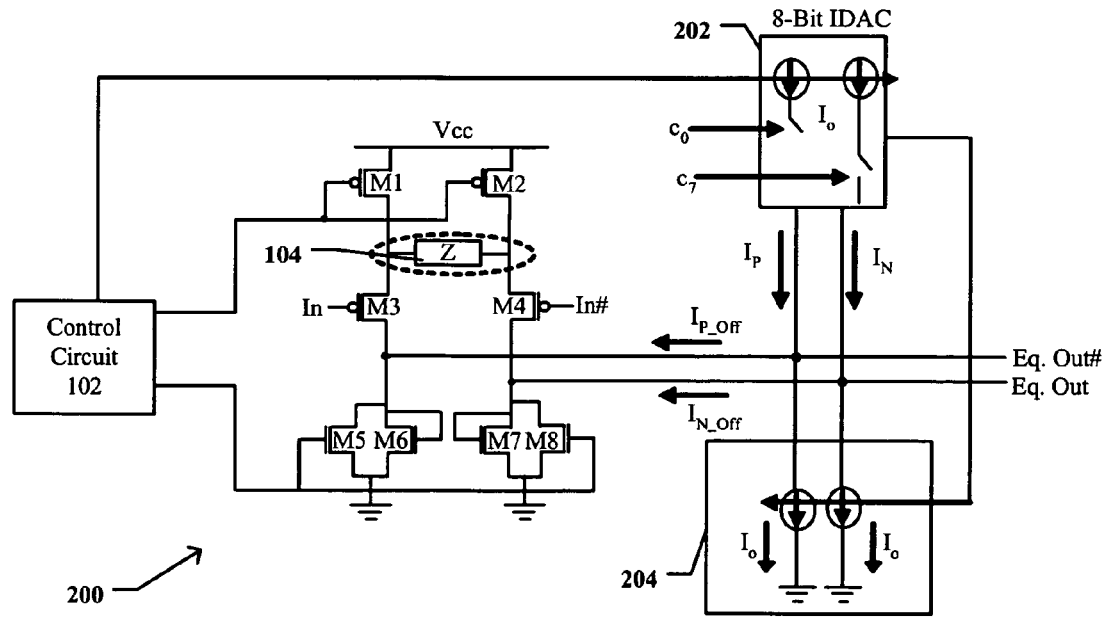
FIG. 2 is a schematic diagram of an equalizer circuit with an offset compensation feature.

FIG. 2 shows an equalizer circuit 200 with a coarse offset control feature. In the depicted circuit, a current digital to analog converter (IDAC) is used at the output of the equalizer circuit 200 to controllably apply a systematic offset applied, e.g., to downstream data comparator/latch circuits (shown in FIG. 3). Circuit 200 generally comprises the equalizer circuit of FIG. 1 with an added differential IDAC circuit 202 and a differential current source 204 coupled at the output (Eq. Out/Eq. Out#) as indicated.

In the depicted embodiment, IDAC 202 is an 8 bit differential IDAC. It has control inputs (C[7:0]) and a differential output with differential signal lines ($I_P/I_N$). The control circuit 102 is coupled to the control inputs to set the current levels at $I_P$ and $I_N$, whose sum is constant at a value of $2I_O$ in the depicted embodiment. For example, if C[7:0] is '00000000, $I_P$ will be at $2I_O$ and $I_N$ will be at 0; if C[7:0] is at "10000000, then both $I_P$ and $I_N$ will be at $I_O$; if C[7:0] is '11111111, then $I_P$ will be at 0 and $I_N$ will be at $2I_O$; and so on.

The differential IDAC output ($I_P/I_N$) is coupled to the equalizer circuit output (Eq. Out/Eq. Out#) and to the input of the differential current source 204. As indicated, the current for each leg of the current source 204 is set at $I_O$. It can be seen that the current ($I_{P\_Off}$) injected into (or extracted from) the "Eq. Out#" node is equal to $I_P$-$I_O$, and the current ($I_{N\_Off}$) injected into (or extracted from) the "Eq. Out" node is $I_N$-$I_O$. Thus, current may be controlled to flow into or drawn out of either output node. With this configuration, when current is added to one output node, the same amount of current is removed from the other node thereby not changing the common-mode value of the differential current in M3/M4

In operation, the voltage offset adjustment circuit (202, 204) can be used for a variety of purposes including but not limited to steady state offset adjustment, margining, residual offset cancellation, and test operations, e.g., during a calibration phase. In some embodiments, up to 400 mV of offset may be applied in either direction.

Figure 3:
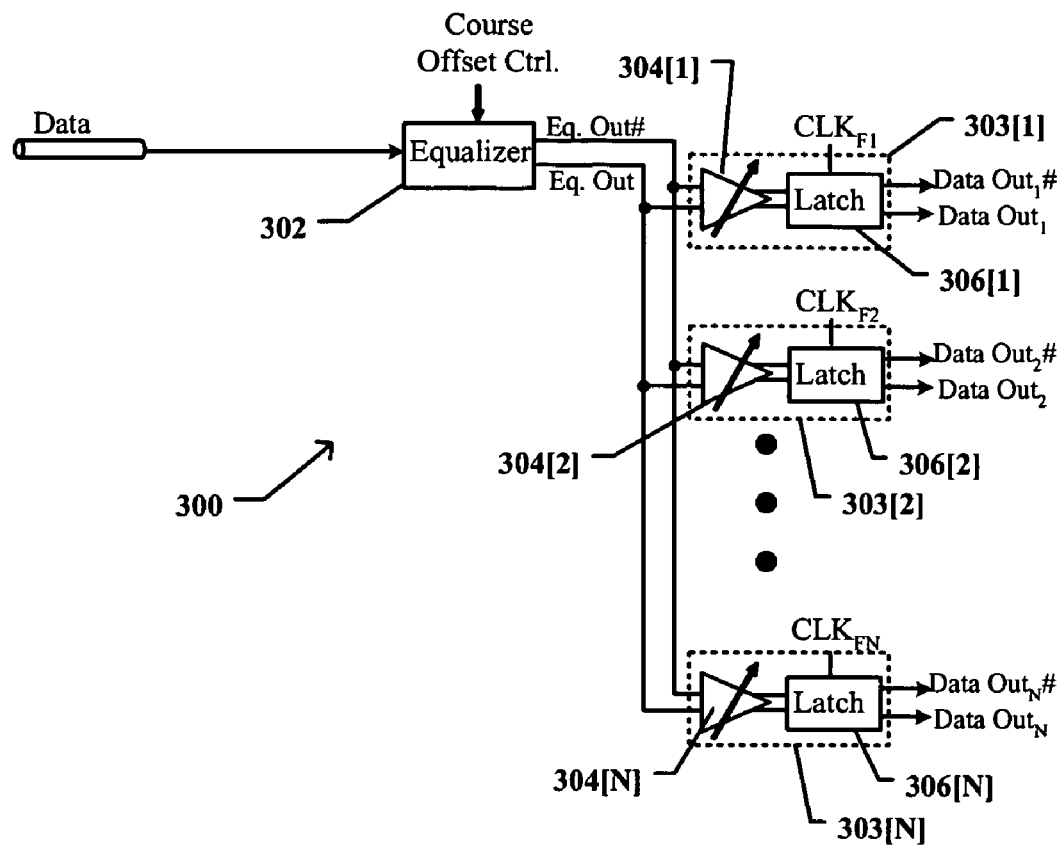
FIG. 3 is a schematic diagram of a receiver side circuit with interleaved, variable offset comparator circuits according to some embodiments.

FIG. 3 shows a receiver circuit 300, having both coarse and fine offset control, in accordance with some embodiments. Receiver 300 generally comprises an equalizer circuit 302 having an input coupled to an incoming data signal and an output (Eq. Out/Eq. Out#) coupled to a plurality of comparator circuits 303. In the depicted embodiment, each comparator 303 is formed from a pre-amplifier 304 (with offset control) and a latch 306. The comparator circuits (303[1] to 303[N]) are interleavably configured to resolve analog data in an assigned phase of the analog output signal (Eq. Out/Eq. Out#) to a differential digital data signal (Data Out$_i$#/Data Out$_i$).

In the depicted embodiment, the equalizer circuit 302 has a coarse offset control feature allowing for systematic offset control applied to each of the downstream comparator/latch circuits. In some embodiments, equalizer circuit 302 may be implemented with an equalizer circuit such as circuit 200 of FIG. 2, although any suitable equalizer circuit, with or without coarse offset control could be used.

Figure 4:
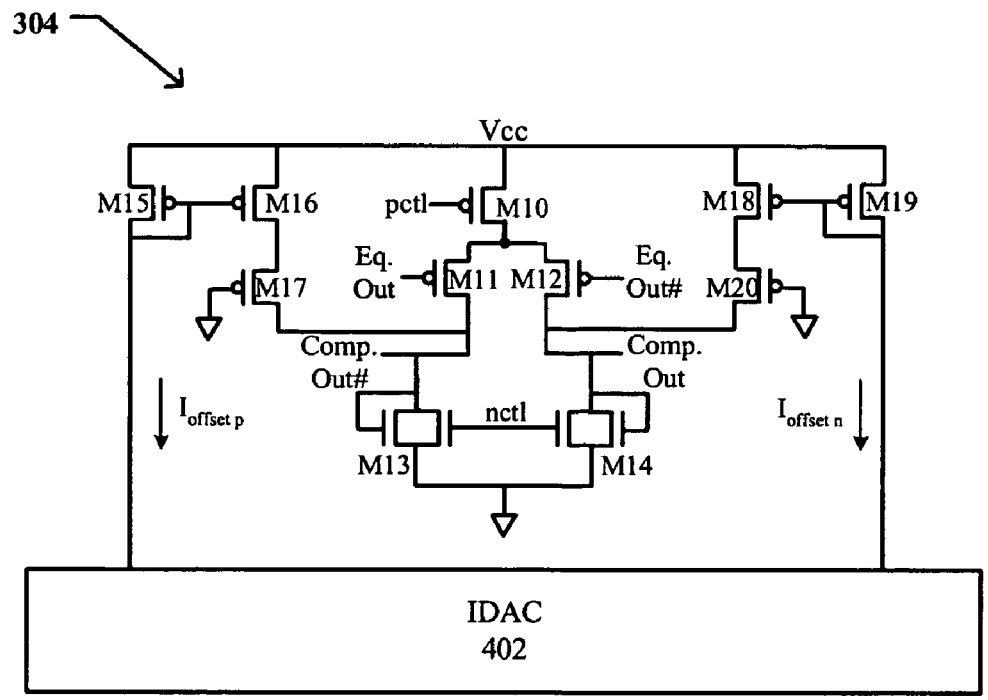
FIG. 4 is a schematic diagram of a variable offset pre-amplifier circuit suitable for use with the circuit of FIG. 3 according to some embodiments.
Figure 5:
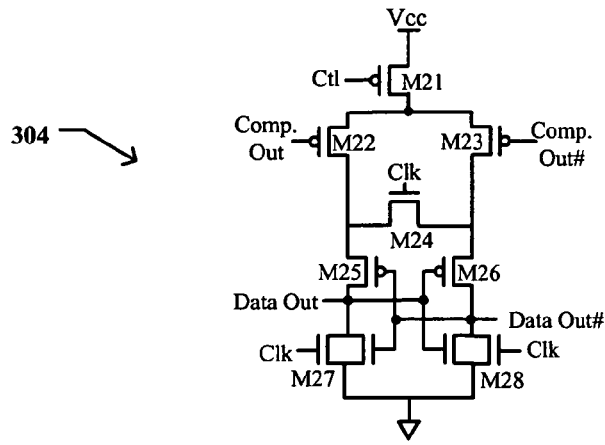
FIG. 5 is a schematic diagram of a latch circuit suitable for use with the circuit of FIG. 3 according to some embodiments.

The pre-amplifiers 304 are implemented with variable offset differential amplifier circuits. An example of a suitable circuit to implement such a pre-amplifier 304 is shown in FIG. 4. Similarly, latch circuit 306 may comprise any suitable latch configuration to latch a digitized differential value provided by an associated pre-amplifier circuit. An example of such a suitable latch circuit is shown in FIG. 5. As indicated in FIG. 3, clock signals of different phases are applied to each latch to interleavably extract data from the equalizer output signal (Eq. Out/Eq. Out#). With variable offset control in each pre-amplifier 304 (e.g., up to 50 mV or so), offset in each comparator circuit 303 may be separately controlled allowing for specific offset compensation. Thus, with the depicted receiver configuration, coarse offset control is systematically provided at the equalizer circuit 302, while fine offset control can be separately provided at each comparator circuit.

FIG. 4 shows a pre-amplifier circuit 304 in accordance with some embodiments. It generally comprises a differential amplifier formed from transistors M10 to M12 and symmetric loads M13, M14, a positive side offset adjustment section formed from transistors M15 to M17, a negative side offset adjustment section formed from transistors M18 to M20, and a current mode digital-to-analog converter circuit 402, all coupled together as indicated. With regard to the differential amplifier section, M10 serves as a current source with a variable bias control via a bias control signal (pctl). Transistors M11 and M12 function as differential input transistors, and symmetric loads M13, M14, provide a dynamic differential load with controllably adjustable characteristics through a bias control signal (nctl). The differential amplifier section receives at its input the output (Eq. Out/Eq. Out#) from the equalizer circuit 302 and provides at its output (Comp Out#/Comp Out) an at least somewhat digitized differential data signal.

The offset adjustment sections (positive side, M15-M17 and negative side, M18-M20) implement current mirror circuits. They interface between the differential current output nodes of IDAC 402, on the one hand, and the positive and negative side output nodes (Comp Out#, Comp Out), on the other hand. By controlling the IDAC 402 differential output current (via a control signal applied at control inputs of the IDAC), the current in either load can be varied in order to adjust offset in the pre-amplifier circuit 304.

FIG. 5 shows a latch circuit 306 suitable for implementation with receiver circuit 300. Latch 306 generally comprises a clocked differential input stage formed from transistors M21 to M23, an equalization transistor M24, and a clocked keeper circuit formed from transistors M25, M26, M27, M28, M29 and M30. In operation, when the clock transitions from a Low to a High value, it latches through to its output (Data Out#/Data Out) the digital value at its input (Comp Out#/Comp Out).

Figure 6:
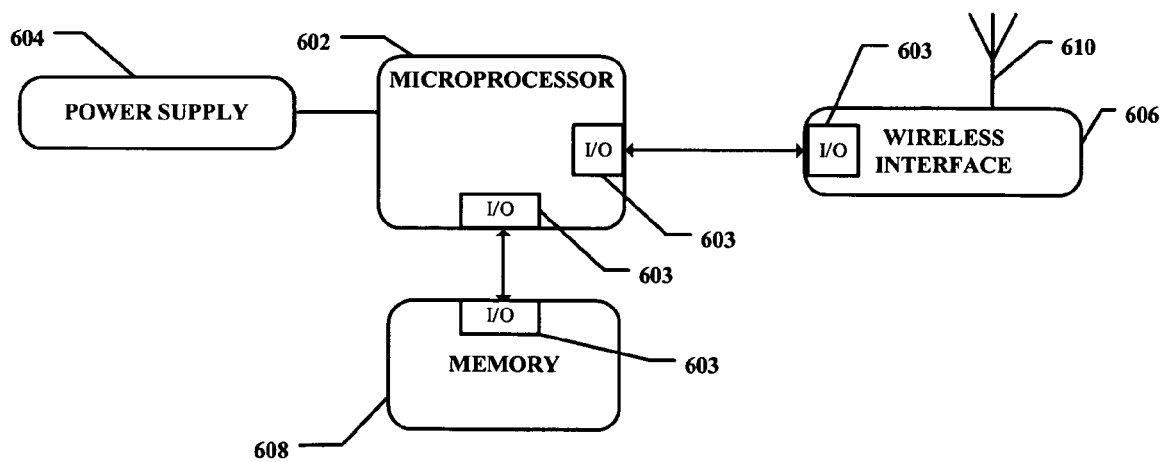
FIG. 6 is a block diagram of a computer system with at least one point-to-point link with a receiver having an equalizer in accordance with some embodiments.

With reference to FIG. 6, one example of a computer system is shown. The depicted system generally comprises a processor 602 that is coupled to a power supply 604, a wireless interface 606, and memory 608. It is coupled to the power supply 604 to receive from it power when in operation. It is coupled to the wireless interface 606 and to the memory 608 with separate point-to-point links formed from I/O modules 603 to communicate with the respective components. In the depicted diagram, each I/O module 603 comprises a bank (e.g., 20) of transmitters and receivers differentially linked to corresponding receivers and transmitter banks, respectively, in the depicted linked I/O modules. Each receiver bank may have one or more receivers with an equalizer and/or offset control feature in accordance with some embodiments disclosed herein. The wireless interface 406 is coupled to an antenna 610 to communicatively link the processor through the wireless interface chip 606 to a wireless network (not shown).

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
    an equalizer circuit in a receiver, the equalizer circuit comprising:
        a differential amplifier having an input to receive a differential data signal,
        a controllably variable complex impedance to implement a filter; and
        an output; and
    at least one controllably variable symmetric load coupled to the differential amplifier output, the output to provide a filtered version of the differential data signal.

2. The chip of claim 1, in which the differential amplifier has a current source comprising a pair of controllably biased transistors coupled together through the complex impedance.

3. The chip of claim 2, in which the complex impedance comprises a controllably variable resistance coupled in parallel with a controllably variable capacitance.

4. The chip of claim 2, in which the at least one symmetric load comprises a diode-connected transistor coupled across a variably biased transistor.

5. The chip of claim 1, further comprising a coarse offset control circuit coupled to the differential amplifier output to controllably adjust offset at the output.

6. The chip of claim 5, in which the coarse offset control circuit comprises a differential IDAC and a differential current source coupled to the differential amplifier output.

7. The chip of claim 1, further comprising a plurality of comparator circuits coupled to the differential amplifier output to interleavably extract digital data from the filtered version of the differential data signal.

8. The chip of claim 7, in which the comparator circuits comprise pre-amplifier circuits with controllably adjustable offsets.

9. The chip of claim 8, in which the differential amplifier circuit has a coarse offset control circuit.

10. A chip comprising:
    an equalizer circuit in a receiver having an output to provide a differential data signal; and
    an offset adjustment circuit coupled to the output, wherein the offset adjustment circuit comprises a current mode digital to analog converter circuit coupled to the output and to a current source, the equalizer circuit comprising at least one controllably variable symmetric load coupled to the output.

11. The chip of claim 10, in which the equalizer circuit comprises a differential amplifier with a controllably variable complex impedance to implement a tuneable high pass filter.

12. The chip of claim 11, further comprising one or more comparator circuits with controllably variable offsets coupled at the output to quantize the provided differential data signal.

13. A chip, comprising:
    a receiver having a differential equalizer circuit coupled to one or more comparator circuits with controllably variable offsets, the one or more comparator circuits comprising a plurality of pre-amplifier circuits coupled to an output of the equalizer circuit to interleavably resolve digital data from an analog differential data signal.

14. The chip of claim 13, in which the equalizer circuit has an offset control circuit to systematically adjust offset of a differential signal provided to the one or more comparator circuits.

15. A system, comprising:
    (a) a microprocessor having an I/O interface with a receiver having a differential equalizer circuit coupled to one or more comparator circuits with controllably variable offsets, the one or more comparator circuits comprising a plurality of comparator circuits coupled to an output of the equalizer circuit to interleavably resolve digital data from an analog differential data signal;
    (b) an antenna; and
    (c) a wireless interface coupled to the microprocessor through the I/O interface and to the antenna to communicatively link the microprocessor to a wireless network.

16. The chip of claim 15, in which the equalizer circuit has an offset control circuit to systematically adjust offset of a differential signal provided to the one or more comparator circuits.

* * * * *